United States Patent [19]

Sprokel

[11] 4,261,650
[45] Apr. 14, 1981

[54] METHOD FOR PRODUCING UNIFORM PARALLEL ALIGNMENT IN LIQUID CRYSTAL CELLS

[75] Inventor: Gerard J. Sprokel, San Jose, Calif.

[73] Assignee: International Business Machines Corporation, Armonk, N.Y.

[21] Appl. No.: 970,496

[22] Filed: Dec. 18, 1978

[51] Int. Cl.³ .............................................. G02F 1/133
[52] U.S. Cl. .................................... 350/341; 427/38; 427/167
[58] Field of Search .................. 350/341; 427/38, 167

[56] References Cited

U.S. PATENT DOCUMENTS

| | | | |
|---|---|---|---|
| 4,038,439 | 7/1977 | Gibson et al. | 350/341 X |
| 4,084,884 | 4/1978 | Raynes | 350/341 X |
| 4,153,529 | 5/1979 | Little et al. | 350/341 X |

Primary Examiner—Edward S. Bauer
Attorney, Agent, or Firm—Joseph E. Kieninger

[57] ABSTRACT

A method of treating the surface of substrates used in liquid crystal display cells so that the surface forces the liquid crystal director to be aligned uniformly over the entire surface and parallel to the substrate surface. The method includes the step of forming a plasma beam containing oxygen free-radicals, inert gas free-radicals such as argon, neon and helium, and free radicals of a compound containing the element to be deposited, for example, silicon, tin, indium, etc. Preferably a volatile organo-silicon or an organo-tin compound is used to supply the silicon or tin. The plasma beam is then directed at the substrate surface at an angle, preferably of about 30°, for a time sufficient to deposit a film. The liquid crystal display cell utilizing a substrate formed in this manner has a high contrast ratio as well as a sharp threshold in its electro-optical characteristics.

6 Claims, 7 Drawing Figures

METHOD FOR PRODUCING UNIFORM PARALLEL ALIGNMENT IN LIQUID CRYSTAL CELLS

DESCRIPTION

1. Technical Field

This invention relates to improved liquid crystal display cells and more particularly to a method for treating the surface of a substrate to provide for uniform parallel alignment.

It is a primary object of this invention to provide an improved method of forcing parallel alignment in a liquid crystal display cell.

It is another object of this invention to provide an improved method for forcing uniform parallel alignment in a liquid crystal display cell.

It is yet another object of this invention to provide an improved method for providing a liquid crystal cell with a sharp threshold.

2. Background Art

The alignment of liquid crystal molecules in liquid crystal devices is important for obtaining a high contrast ratio. In certain liquid crystal applications, it is also desirable to have a well-defined threshold. To have a well-defined threshold, it is necessary to have the molecules aligned parallel to the substrate.

In general, liquid crystals show spontaneous ordering over some short distance, described by a directional unit vector which is commonly referred to as the liquid crystal director. In order to make an operating displace, the director alignment must be uniform over the dimensions of the cell.

The patent to Janning, U.S. Pat. No. 3,834,792, describes a method of aligning the molecules of liquid crystals in the direction of the film growth. A liquid crystal display cell, which has two such alignment films therein, is used to form a polarizing liquid crystal display cell. Commercial twisted nematic displays such as watch displays use this technique. While this technique forces the liquid crystal director to be aligned uniformly over large areas, the molecules are, in general, tilted out of the plane of the substrate surface as is shown in FIGS. 1A and 1B. Tilted cells such as these do not have a well-defined threshold. As a result, the driving signals in watch displays cannot be effectively time-multiplexed and these displays are, therefore, not matrix-addressed. They require one contact per segment, which results in about 24 to 28 contacts for a typical watch display. With this type of alignment, one sacrifices threshold for uniformity in alignment.

The patent to Gibson et al, U.S. Pat. No. 4,038,439, and assigned to the assignee of this invention, describes an RF plasma technique which induces molecular alignment parallel with the substrate surface as shown in FIG. 2A. Although the liquid crystal molecules are aligned parallel with the substrate surface, the alignment of the liquid crystal director will be non-uniform over the entire surface as shown in FIG. 2B and will be characterized by numerous disclinations. Such cells have a well defined threshold and they are well suited for certain applications, such as thermally-addressed displays based on smectic to nematic transition where uniform alignment within a plane is not required. However, for other types of cells, e.g. twisted nematic displays, uniform alignment within a plane is absolutely necessary.

BRIEF DESCRIPTION OF THE DRAWING

In the accompanying drawings forming a material part of this disclosure:

FIG. 1A is a cross-sectional view of a prior art cell having uniform alignment.

FIG. 2A is a cross-sectional view of a prior art cell having molecules aligned in planes parallel to the substrate surface figure.

DISCLOSURE OF INVENTION

For a further understanding of the invention and of the objects and advantages thereof, reference will be had to the following description and accompanying drawings, and to the appended claims in which the various novel features of the invention are more particularly set forth.

A method of treating the surface of substrates used in liquid crystal display cells so that the surface forces the liquid crystal director to be aligned over the entire surface and parallel to the substrate surface is described. The method includes the step of forming a plasma beam containing oxygen free radicals, inert gas free radicals such as argon, neon and helium, and free radicals of a compound containing the element to be deposited, for example, silicon, tin, indium, and so forth. Preferably a volatile organo-silicon or an organo-tin compound is used to supply the silicon or tin. The plasma beam is then directed at the substrate surface at an angle of between 20° to 40° for a time sufficient to deposit a film. Preferably the angle is about 30°. The liquid crystal display cell utilizing a substrate formed in this manner has a high contrast ratio, as well as a sharp threshold in its electro-optical characteristics.

BEST MODE FOR CARRYING OUT THE INVENTION

Figure 3A:
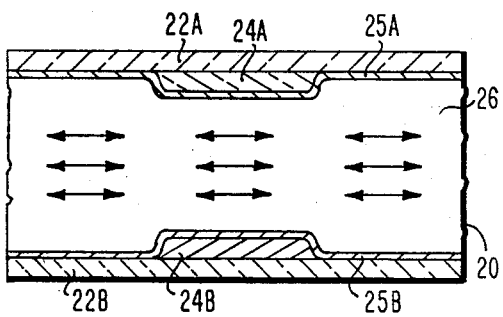
FIG. 3A is a cross-sectional view of a cell in accordance with this invention.

As shown in FIG. 3A, a liquid crystal display cell 20 has a pair of polished glass substrates 22A and 22B. Provided on the facing surfaces of 22A and 22B are film portions 24A and 24B, respectively, of a transparent conductive material, such as tin-doped indium oxide. Typically, tin-doped indium oxide film is deposited on the substrate 22A and 22B by r.f. sputtering from a target containing 90% $In_2O_3$–10% $SnO_2$ or by DC magnetron sputtering from an In-Sn cathode in oxygen followed by annealing. The portions 24A and 24B are formed by etching using conventional photolithographic techniques which leave a layer of photoresist (not shown) on top of the portions 14A and 14B. Between the substrate 22A and 22B and the transparent conductive film portions 24A and 24B is a layer 26 of a positive dielectric liquid crystal material such as pentylcyanobiphenyl.

The method for treating the substrates so that the surface layer forces the liquid crystal director to be aligned uniformly parallel with the substrate surface throughout the cell uses a new type radio frequency (r.f.) plasma system.

Figure 4:
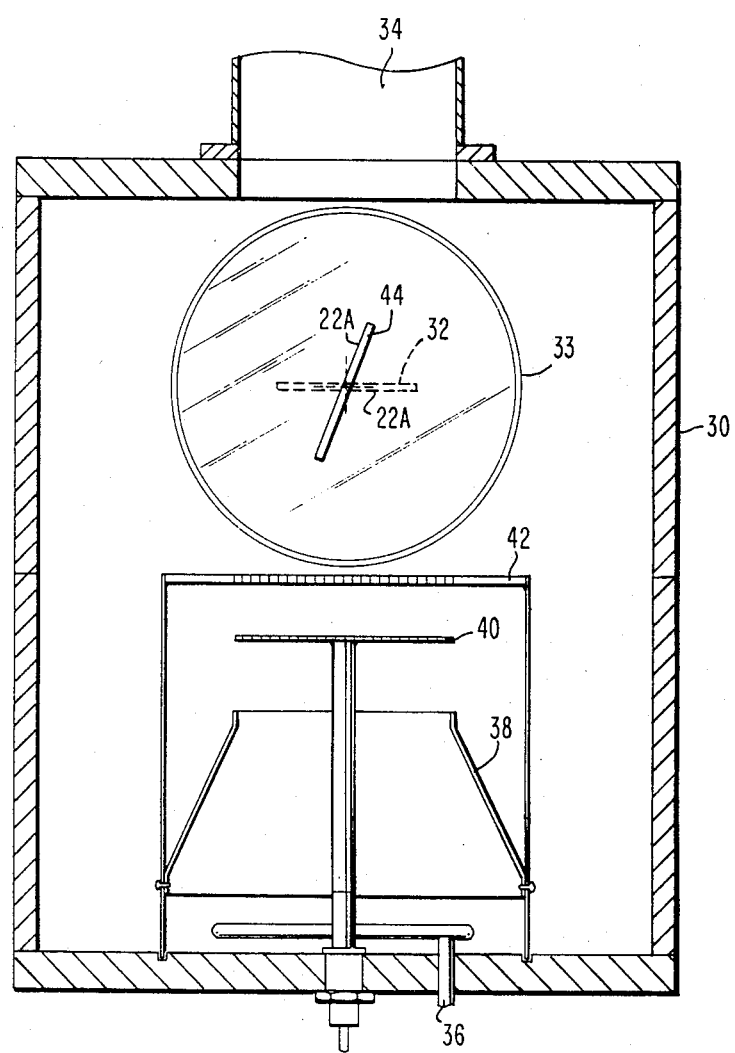
FIG. 4 is a cross-sectional view of an apparatus used to form the cells of FIGS. 3A and 3B.

FIG. 4 is a schematic drawing of this r.f. beam plasma system. Referring to FIG. 4, the perforated plates, r.f. electrode 40 and ground electrode 42, form a parallel plate capacitor delineating the discharge region. The r.f. electrode 40 is connected to an r.f. generator (not shown) via an impedance matching network as is common practice in this art. If the generator is turned on and the matching network is tuned, a large r.f. field appears between the electrodes 40 and 42 ionizing the gas in this space. Nearly all of the r.f. energy flowing into the system is discharged in this space.

The gas mixture enters the chamber through diffuser 36 and is directed by deflector 38 into the discharge region. The gas energizing from the ground electrode 42 contains a large amount of ionized and excited molecules and free radicals. For appropriate conditions of gas pressure, flow rate, gas composition and r.f. power a beam of ionized and excited molecules is established between the ground electrode and exit port 34. This plasma beam can produce a large variety of chemical reactions including chemical etching, ion etching and deposition of metal oxide and polymer films.

The substrates 22 are mounted in a frame (not shown) positioned in the plasma beam. The frame can be rotated around an axis perpendicular to the beam direction such that any angle between the substrate surface and the beam direction can be selected. As will be shown, this angle is a critical parameter during the deposition of the aligning layer. It is not critical for other applications such as cleaning or photo resist removal.

The distance between the substrates 22 and the ground electrode 42 is a compromise. Etching and deposition rates increase as this distance is made shorter, but the effect of the deposition angle decreases.

In order to establish a clean surface free from organic contaminants, the substrates are usually positioned normal to the beam direction as indicated by position 32 in FIG. 4. A mixture of 60% argon, 40% oxygen is admitted. The precise ratio is not important as long as there is some excess Argon. The chamber pressure is 10–25 millitorr, the r.f. power input is 300 Watt. About 15 minutes is sufficient to remove the organic film.

The next step is the deposition of the aligning layer designated as 25A in FIG. 3A.

The substrate is rotated from position 32 to position 44. The vapor of an organo silicon compound is mixed with the Ar $1O_2$ mixture. The chamber pressure is now 25–35 millitorr and the r.f. power is maintained at 300 W. During the changeover the matching network will require returning.

The organo silicon compound forms the source of the $SiO_2$ film to be deposited. A number of compounds have a vapor pressure suitable for room temperature operation. Non-limiting examples are: bis-(dimethylamino)-dimethylsilane (silar catalog number 1420), ally trimethylsilane (silar 1010), divinyl tetramethyl disiloxane (silar 1154), cyano ethyl trimethyl silane (silar 1061). Silane itself is an obvious choice but the danger in handling this compound makes it less desirable.

Figure 1B:
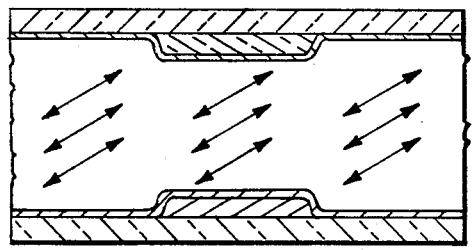
FIG. 1B is a top view of the cell in FIG. 1A and which illustrates the molecules being tilted out of the plane of the substrate surface.
Figure 1B:
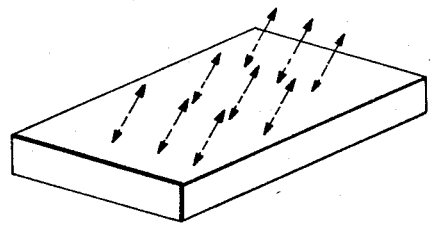
Figure 2B:
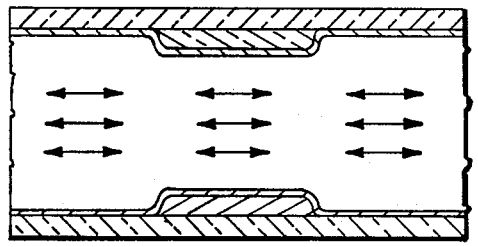
FIG. 2B is a top view of the cell of FIG. 2A showing the random orientation of the molecules in these planes.
Figure 2B:
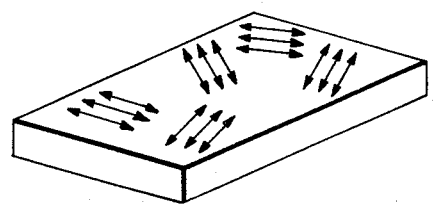

The organo silicon compound is fragmented in the discharge region and finally completely oxidized to $SiO_2$ at, or very near to, the substrate 22 surface. The type of liquid crystal alignment which will be achieved is determined by the topology of the $SiO_2$ deposit. In turn, this topology is determined by the angle of incidence of the plasma beam. Three regions can be distinguished:

At normal or near-normal incidence, 90°–70°, of the plasma beam, the liquid crystal director will align parallel with the substrate surface, but turn in no preferred orientation in this plan. The net effect is a mosaic structure of areas, each aligned parallel with the surface but each in a different orientation. Sharp boundary lines, called disclinations, separate these areas. This structure is identical with that of FIG. 2B already established in the prior art;

As the incidence angle is decreased the liquid crystal directors begin to show more ordering. At about 45° two preferred orientations can be distinguished. Areas orient either in the beam direction or perpendicular to it. The irregular disclination lines have now become parallel lines running across the length of the sample in the beam direction. Such surfaces can make twisted nematic cells, but they are not considered cosmetically acceptable;

As the angle of incidence is decreased further, the distance between disclination lines widens until at about 30° incidence angle the entire cell surface shows uniform orientation. The preferred direction is perpendicular to the beam direction. If the incidence angle is decreased further, no further change occurs, the samples remain uniformly parallel aligned but the required exposure time increases.

It will be evident now that conventional "tunnel" or "diode" r.f. plasma systems cannot produce $SiO_2$ films which force uniform alignment. The geometry is such that the $SiO_2$ aligning film is isotropic. In order to produce topologically anisotropic $SiO_2$ films which will force uniform parallel liquid crystal alignment, a beam r.f. plasma system had to be used.

The preferred angle is 30° with a preferred range being 25° to 35°. For certain applications an angle of up to 40° may be satisfactory. The smallest angle would be about 5° even though this angle would require a long exposure time.

Figure 3B:
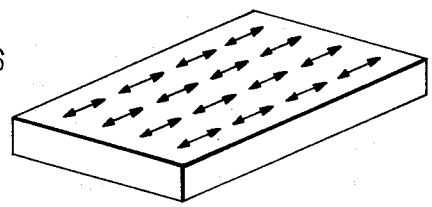
FIG. 3B is a top view of the cell shown in FIG. 3A.

A structure similar to that shown in FIGS. 3A and 3B having uniform parallel alignment may be formed in accordance with another embodiment of this invention with a thin film of tin oxide, $SnO_2$, instead of $SiO_2$. In this embodiment a volatile organic tin compound instead of the volatile organo silicon compound is introduced to form a thin film 25A and 25B of $SnO_2$. Non-limiting examples of volatile organic tin compounds are tetrabutyl tin and tetramethyl tin.

INDUSTRIAL APPLICABILITY

The advantages of the liquid crystal cells made in accordance with this invention are that they have a high threshold and a high contrast ratio. They are particularly useful for twisted nematic liquid crystal cells and they are suitable for matrix addressing.

While I have illustrated and described the preferred embodiments of my invention, it is understood that I do not limit myself to the precise constructions herein disclosed and the right is reserved to all changes and modifications coming within the scope of the invention as defined in the appended claims.

I claim:

1. A method of treating the surface of substrates used in liquid crystal display cells so that the surface forces the liquid crystal director to be aligned uniformly over the entire surface and parallel with the substrate surface comprising the steps of forming a r.f. plasma beam containing oxygen free radicals, inert gas free radicals and free radicals of a compound containing the element taken from the group consisting of silicon, tin and indium, and directing said plasma beam at an angle of incidence of 5° to 40° to said substrate for a time sufficient to deposit a film at least about 100 angstroms thick.

2. A method as described in claim 1 whereby said plasma beam is directed at an angle of 25° to 35°.

3. A method as described in claim 1 whereby said plasma beam contains argon free radicals.

4. A method as described in claim 1 whereby said plasma beam contains free radicals of a volatile organo silicon compound.

5. A method as described in claim 1 whereby said plasma beam contains free radicals of a volatile organo tin compound.

6. A method of treating the surface of substrates used in liquid crystal display cells so that the surface forces the liquid crystal director to be aligned uniformly over the entire surface and parallel with the substrate surface comprising the steps of forming a r.f. plasma beam containing oxygen free radicals, directing said plasma beam at an angle of incidence of about 90° to said substrate for a time sufficient to clean said substrate, forming a r.f. plasma beam containing oxygen free radicals, inert gas free radicals and free radicals of a compound containing the element taken from the group consisting of silicon, tin and indium, and directing said plasma beam at an angle of incidence of 20° to 40° to said substrate for a time sufficient to deposit a film at least about 100 angstroms thick.

* * * * *